United States Patent Office 3,539,346

Patented Nov. 10, 1970

3,539,346

PHOTOSENSITIVE COMPOSITION CONTAINING A PYRAZOLE, AN AROMATIC AMINE AND AN ORGANIC HALOGEN COMPOUND

Balwant Singh and William Arthur Henderson, Jr., Stamford, Conn., and Edwin Fisher Ullman, Atherton, San Mateo, Calif., assignors to American Cyanamid Company, Stamford, Conn., a corporation of Maine

No Drawing. Filed Dec. 20, 1966, Ser. No. 603,171
Int. Cl. G03c *1/52*
U.S. Cl. 96—90 10 Claims

ABSTRACT OF THE DISCLOSURE

Photosensitive compositions, typically a mixture of 4-amino-3,5-diphenylpyrazole, diphenylamine or phenol, and chloroform. The compositions, alone or on a substrate such as paper, become intensely colored when irradiated with UV light, and are useful in photocopying.

RELATED APPPLICATION

Related to this invention is U.S. patent application Ser. No. 603,172, filed simultaneously herewith and incorporated herein by reference. The related application discloses arizine intermediates, and process for preparation, useful in preparing the 4-amino-3,5-disubstituted pyrazole components of the present invention.

BACKGROUND

This invention relates to the field of photosensitive compositions containing an aromatic amine compound or a phenolic compound and an organic halogen compound.

Photosensitive compositions of this general class are known as described, for example, in "Light-Sensitive Systems," J. Kosar, John Wiley & Sons, Inc., New York (1965), pages 361–370, and U.S. Pat. No. 3,042,515 to Wainer. While advantageous in many respects, such compositions often give inadequate intensity or brilliance of color when irradiated with actinic light.

SUMMARY

In general terms, the present invention is a photosensitive composition comprising a mixture of a 4-amino-3,5-disubstituted pyrazole, an aromatic amine or a phenolic compound, and an organic halogen compound. The invention also includes photosensitive articles comprising a substrate contacted with the photosensitive composition or a matrix containing the photosensitive composition. When irradiated with actinic light, particularly ultraviolet, a photoreaction occurs, accompanied by irreversible, intense coloration. The compositions are therefore useful in photosensitive articles and devices such as photocopy paper and photocopying machines.

DESCRIPTION

The 4-amino-3,5-disubstituted pyrazole compounds may be represented by the Formula II:

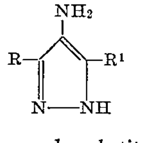

(II)

wherein R and $R^1$ are aryl, substituted or unsubstituted, or alkyl. Typically, aryl may be phenyl, naphthyl, or anthracyl and the substituents therefor may be alkyl, alkoxy, alkylthio, acyl, acyloxy, cyano, dialkylamino, amido, halogen, or trifluoromethyl. The number of carbon atoms in alkyl, alkoxy, alkylthio or dialkylamino may range from 1 to about 18 inclusive, preferably from 1 to 8 carbon atoms inclusive (lower alkyl). Acyl includes

and acyloxy includes

wherein $R^2$ in each group is aliphatic (e.g., $C_1$–$C_8$), aromatic (e.g., phenyl and naphthyl) or hydrogen. Amido includes

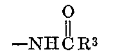

wherein $R^3$ is aliphatic (e.g., $C_1$–$C_8$) or aromatic (e.g., phenyl or naphthyl). Halogen includes chloro, bromo, iodo and fluoro. R and $R^1$ in Formula II may be the same or different and, obviously, other substituents for aryl may be employed provided they do not interfere substantially with the photosensitivity of the composition.

Representative 4-amino-3,5-disubstituted pyrazoles include the following compounds:

4-amino-3,5-diphenylpyrazole
4-amino-3,5-bis(p-methoxyphenyl)pyrazole
4-amino-3,5-ditolylpyrazole
4-amino-3,5-bis(p-methylthiophenyl)pyrazole
4-amino-3,5-bis(p-acetylphenyl)pyrazole
4-amino-3,5-bis(p-acetoxyphenyl)pyrazole
4-amino-3,5-bis(p-dimethylaminophenyl)pyrazole
4-amino-3,5-bis(p-methylamidophenyl)pyrazole
4-amino-3,5-bis(o-chlorophenyl)pyrazole
4-amino-3,5-bis(p-cyanophenyl)pyrazole
4-amino-3,5-bis(p-trifluoromethylphenyl)pyrazole
4-amino-3-phenyl-5-methylpyrazole
4-amino-3-p-cyanophenyl-5-n-butylpyrazole
4amino-3-p-methoxyphenyl-5-heptylpyrazole
4-amino-3-tolyl-5-ethylpyrazole Many of the pyrazole compounds useful in the compositions of the invention are known. In general, they may be prepared from the corresponding azirines, Formula I below, by reaction in an inert solvent medium of the azirine and the hydrazine acid salt $NH_2NH_2{\cdot}A$ where R and $R^1$ are as defined above and A is an acid, mineral or carboxylic, mono or polybasic, such as perchloric, hydrochloric, sulfuric, nitric, acetate, borate, malate, phthlate, and the like.

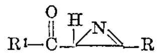

(I)

Reaction occurs readily at about 60° C. but also may be effected at or below room temperature or up to 100° C. or higher depending on proportions of reactants and solvent medium. Other details of the reaction are disclosed in the related U.S. patent application mentioned above.

The aromatic amine or phenolic component of the photosensitive compositions should have an amino or hydroxy group, respectively, directly attached to an aryl nucleus and a hydrogen atom in a position on the aryl nucleus ortho or para to the amino or hydroxy group. An equivalent characterization is that the aromatic amine or phenol is unsubstituted or "activated" in at least one of the positions on the aryl nucleus ortho or para to the amino group. Applicants believe the reason for this requirement is that, as depicted below with respect to the aromatic amine, the N-halo intermediate (III) formed by irradiation of (II) in the presence of the organic halogen compound, typically $R^4X$ where $R^4$ is aliphatic, alicyclic, or aromatic and X is halogen, reacts only with the highly activated ortho and para positions of the aromatic amine or phenol.

(B)

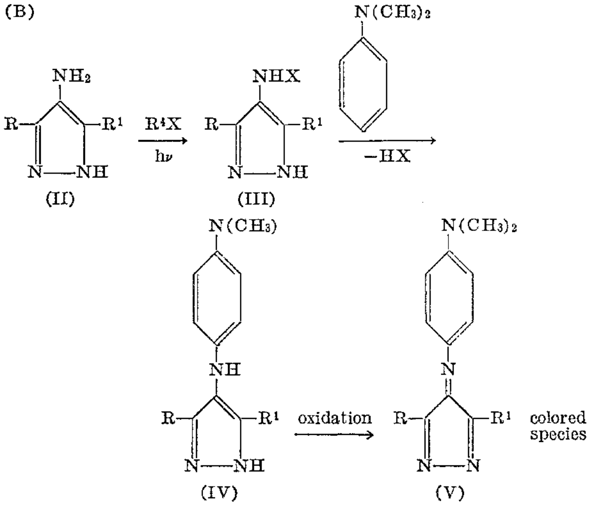

In the reaction above $R^4X$ is the organic halogen compound, which reacts with pyrazole (II) to form intermediate (III). Following this oxidation step the intermediate (III) couples with the aromatic amine, typically N,N-dimethylaniline, to form color producing species (IV). Color forming species (IV) may result as the structure shown by abstraction of hydrogen halide but more often results as the acid halide salt. The colored species is believed best represented by (V) and is formed by oxidation. It should be understood that this explanation, while useful to an understanding of the reaction, is not a critical limitation on the invention.

The aromatic amine compound may be a mono or polyamine and the aromatic group may be phenyl, naphthyl or anthracyl. Other substituents may be present in the structure provided they do not substantially reduce the activation of the ortho or para position towards the phenolic or organic halogen compound. Deactivation occurs when the amine nitrogen atom carries a second or third substituent and the ortho position on the substituent aryl nucleus is also substituted. The resulting steric hindrance prevents coplanarity with the aromatic ring of the amine and therefore reactivity is decreased.

The preferred aromatic amines have the formula $$B-\underset{\substack{| \\ Y}}{N}-X$$

where B is the aryl nucleus, unsubstituted or substituted, and X and Y are alkyl, aryl, aralkyl, alkaryl, or hydrogen, each the same or different. Particularly preferred are the primary aromatic amines wherein aryl nucleus B carries inert, e.g., hydrocarbon, substituents or electron donating substituents, e.g., hydroxy, at positions other than the activated ortho or para position.

While only one activated ortho or para position is required, aromatic amines having more than one activated ortho or para position are useful.

Typical suitable aromatic amines include the following:

diphenylamine
triphenylamine
indole
naphthylamine
aniline
4-nitroaniline
3,5-dimethylaniline
2-benzoylaniline
2-bromoaniline
2,4-dibromoaniline
2,4-dimethylaniline
2,6-dichloroaniline
N,N-dimethylaniline
4-carbomethoxyl-N,N-dimethylaniline
4-bromo-N,N-dimethylaniline
4-methyl-N,N-dimethylaniline
N-phenyl-o-phenylenediamine The phenolic compounds, which may be employed as substitutes for or in admixture with the aromatic amines, include phenol, meta- and para-cresol, resorcinol, 3-benzoylphenol, and, in general, phenols having a hydrogen atom at a position on the aryl nucleus ortho or para to the hydroxy group.

As compared with compositions containing the aromatic amines, which give violet, blue, and green hues on irradiation, the phenol containing compositions provide pink-red colors on irradiation. The aromatic amine containing compositions are preferred due to deeper color and relatively greater usefulness for photocopying.

The organic halogen compounds are any such compounds from which a halogen radical may be abstracted by the pyrazole compound in an oxidation step and which do not otherwise interfere with the photosensitivity of the composition.

Suitable organic halogen compounds are halogenated hydrocarbons ($R^4X$ alkyl halides) such as chloroform, bromoform, iodoform, carbon tetrachloride, carbon tetrabromide, methylene chloride, methylene bromide, methylene iodide, hexachloroethane, hexabromoethane, and the like. The halogens themselves are not suitable since they promote color without irradiation and often destroy by oxidation the colored species.

In addition to the halogenated hydrocarbons, other useful halogen containing organic compounds include polymers such as polyvinylchloride, the various chlorinated polyethers, and the polychlorinated derivatives of biphenyl and the chlorobiphenyl resins known as "Arochlors." It follows that a wide variety of halogen containing organic compounds will be effective and their usefulness is limited only by the ability of the pyrazole to abstract the halogen. One particularly useful solid halogen compound is $\alpha,\alpha,\beta,\beta$-tetrabromo-o-xylene.

The organic halogen compound and aromatic amine or phenol may be in any physical state under ambient conditions effective to provide reactive contact with the pyrazole. Hence, the individual components of the photosensitive composition may be solid or liquid materials, or even gases. Preferably the compositions are liquid mixtures or finely divided solids.

The photosensitive compositions are prepared conveniently by simple admixture in any order. When the pyrazole and aromatic amine or phenolic components are solids, they may be first intimately mixed and then dissolved in a solvent which may be the halogen containing organic compound.

At least one equivalent of organic halogen compound and aromatic amine or phenol is employed per equivalent of pyrazole compound in the photosensitive compositions of the invention. Preferably, an excess of aromatic amine or phenol and organic halogen compound over one equivalent of pyrazole compound will be employed since the oxidized intermediate (III) is believed unstable and a statistically better chance of coupling with the aromatic amine will result when excess aromatic amine or phenol and halogen containing compound are employed. Thus, two equivalents or more of aromatic amine or phenol and organic halogen compound are useful since the pyrazole compound contains two replaceable hydrogen atoms.

Other ingredients may be incorporated in the photosensitive composition of the invention. Such optional ingredients include color stabilizers to eliminate or reduce fading of the color of an image and color inhibitors to prevent coloration around the image due to ultraviolet light in ambient light. Typical of color stabilizers are alkyl amines and alkylene compounds and representative of the color inhibitors are polyhydric phenols such as catechol, and amino phenols such as o-aminophenol and para-aminophenol.

The compositions of the invention are useful in the preparation of photosensitive articles such as photocopy paper, siliceous plates, or plastic films. The paper substrate may be cellulosic or synthetic of the numerous forms well known in the art. Typical of the synthetic, noncellulosic papers may be mentioned paper prepared from polyacrylonitrile textile filaments which are chopped, slurried, and sheeted by conventional methods.

In preparing photosensitive paper, compositions of the invention are formulated as solutions and then sprayed on the paper or the paper is dipped in the solution. In some instances, it is also possible to incorporate the photosensitive compositions into the paper matrix at some step in the preparation thereof, for example, as a beater additive. When a substantially dry paper product is desired, as is the usual case, the organic halogen compound component should be chosen so as substantially to remain in the composition when the coated paper is dried. Thus, low boiling halogenated hydrocarbons are not preferred for such applications although they may be employed secondarily as solvents for the basic components. The aforementioned $\alpha,\alpha,\beta,\beta$-tetrabromo-o-xylene is a preferred halogenated compound since it does not volatilize under ordinary paper drying conditions.

As siliceous substrate for the photosensitive composition may be mentioned quartz, mica, and glass compositions in their many commercially available forms such as window glass, microscope slide glass, high silica content glass, and the like. In a manner similar to the coating or impregnating of paper, the photosensitive composition may be applied to the siliceous substrate by any convenient means including spraying, dipping, spreading, coating, and the like. The photosensitive composition may be applied to the substrate under ambient temperature conditions which is then heated to volatilize the solvent. Alternatively, the siliceous substrate is preheated and the photosensitive composition sprayed thereon.

It should be understood that heating of the coated paper or siliceous substrate is for the purpose of obtaining a dry article. In most cases, drying is accompanied by evaporation of a solvent. Since the organic halogen compound is essential to the composition, if drying by volatilization of a solvent is desired, the organic halogen compound should be a compound which volatilizes at a temperature substantially higher than that of the drying conditions. Coating and drying of the substrate is therefore best achieved by employing a relatively high boiling organic halogen compound together with a lower boiling solvent which may be, but not necessarily, a second organic halogen compound. In each instance, it is obvious that drying of the coated substrate may be achieved simply by open storage of the coated substrate under ambient conditions. However, this may take too long for practicality and heating may therefore be desired.

A third important catagory of substrate or matrix materials is plastics. Techniques for incorporationg photosensitive compositions in or on plastics are known. For example, it is common practice to disperse or dissolve a photosensitive composition in a film-forming resin containing a mutual solvent for the resin and photosensitive composition. The resins include any of the optical quality thermoplastic resinous materials, oxygen or non-oxygen containing, such as polymethylmethacrylate, polyethylmethacrylate, polybutylmethacrylate, polystyrene, polyvinylchloride, polyvinylacetate, cellulose acetate, cellulose acetate butyrate, regenerated cellulose (cello-phane), polyethylene, cellulose nitrate, chlorinated rubber, and the like. The film-forming resins may be employed as monomers, as partially polymerized materials, or as polymers. From about 0.01 to 20%, preferably 0.1 to 10% by weight of the photosensitive coposition in the film-forming carrier or binder is generally suitable. As already mentioned, the organic halogen compound of the photosensitive composition should be a high boiling material relative to the solvent which is evaporated from the film-forming resin composition such that the organic halogen compound remains in the composition.

Prior to evaporation of solvent from the mixture containing the film-forming resin and photosensitive composition, the mixture may be deposited on a base such as glass, paper, plastic film, plastic casting, and the like.

The quantity or thickness of the resulting photosensitive composition in the binder material or on the substrate is not critical, sufficient being required only for uniform distribution over the substrate, and so distributed, that the color change induced by irradiation may be visually observed.

The photosensitive compositions of the invention provide rapid and intense coloration on irradiation, particularly with ultraviolet light. Coloration is substantially complete in about 1 to 10 seconds, although in some compositions the greatest intensity of coloration may require about one minute irradiation.

Ultraviolet light is the preferred radiation and any convenient source may be employed for this purpose. Radiation in the range of about 200 to 400 millimicrons is effective. The preferred range is 290 to 375 millimicrons. Irradiation is conducted in an oxygen containing atmosphere since very little color develops in the absence of oxygen.

While it is usual to irradiate the full composition, it has been surprisingly noted that irradiation of a mixture of the pyrazole and organic halogen compound followed by addition of the aromatic amine or phenol gives equally intense color. Substantially no color develops, with or without irradiation, until the third ingredient is present.

The stability of the coloration or image defined by the color change may be further enhanced ("fixed") by washing the substrate or matrix coated with or containing the photosensitive composition with a solvent for unreacted or non-colored species in the composition. Non-polar solvents, such as benzene and diethyl ether are particularly suitable. Moreover, if the photosensitive composition contained a low boiling organic halogen compound, unreacted amounts of this compound may be removed by heating the coated or impregnated article.

An important advantage of the compositions of the invention, and of substrates coated with or matrices incorporating, the compositions, is substantial inertness to color change under ambient daylight conditions, although daylight contains some ultraviolet. Thus, the compositions may effectively be employed in the preparation of photocopy paper. However, if the photocopy paper is to be stored for long periods of time under ambient light conditions, is preferably packaged to prevent exposure to ambient light.

Paper, siliceous substrates, and plastic film coated or impregnated with the photosensitive compositions of the invention are employed as photocopying articles in the conventional manner. For example, paper coated with the photosensitive composition may be exposed to ultraviolet light which is passed through or reflected from an image bearing plate such as a photographic negative or paper carrying a positive image. The photocopy paper is thereby colored in a pattern corresponding to the image on the original.

Numerous other aromatic amines, organic halogen compounds and phenolic compounds are useful in the present compositions. Readily available publications on photosensitive compositions, such as the aforementioned text by J. Kosar and patents cited therein, are available and the routineer may refer thereto for further examples, including information on other ingredients, substrates and binder materials.

The following examples further illustrate the invention but are not limitative thereof except as indicated in the appended claims. All parts and percentages are by weight unless otherwise specified.

EXAMPLE 1

A mixture of 4-amino-3,5-diphenylpyrazole (300 milligrams), 4-bromo-N,N-dimethylaniline (420 milligrams) and $\alpha,\alpha,\beta,\beta$-tetrabromo-o-xylene (420 milligrams) was dissolved in 20 milliliters of chloroform by warming on a steam bath. The resulting photosensitive solution was filtered and then sprayed on paper and air dried.

Exposure of the thus-coated paper, or the solution alone, to ultraviolet light from a Hanovia medium pressure mercury lamp at 6 to 8 inches distance for 5 to 10 seconds caused formation of a deep greenish-blue color. When a negative transparency is placed in the ultraviolet light path, a corresponding positive image, defined by the color change, is produced on the coated paper. Substantially the same results are obtained if glass or porcelain is substituted for the paper.

EXAMPLE 2

Equal volumes of the photosensitive solution of Example 1 and a solution of polyvinylchloride in chloroform (100 milligrams/milliliters) were admixed. The resulting solution was then spread as a thin film on glass and air dried. Irradiation of the coated glass with ultraviolet light for one minute caused appearance of a deep green-blue color in the film.

EXAMPLES 3–19

Table I below illustrates other photosensitive compositions of the invention, each containing 4-amino-3,5-diphenylpyrazole dissolved in chloroform, in addition to the aromatic amine of the example. The composition of each example was subjected to two tests for photo-induced color change. In the first test, 0.5 milliliters of a saturated solution of the pyrazole compound in chloroform was irradiated for 30 seconds with 230–420 millimicron ultraviolet light, employing a General Electric 1000 watt high pressure mercury lamp and Corning No. 9863 filter. The irradiation was then stopped and 20 milligrams of the aromatic amine added. The second test was conducted as in the first except for addition of the aromatic amine to the solution of pyrazole compound in chloroform prior to irradiation. In the first test, coloration was observed upon addition of the aromatic amine. In the second test, color developed upon irradiation. The tests thus demonstrate the importance of the aromatic amine. In the second test, color developed upon irradiation. The tests thus demonstrate the importance of the armomatic amine for photo-induced color change. In each test, the colors were intensely green, blue or violet.

Table I

| Aromatic amine: | Example |
|---|---|
| Diphenylamine | 3 |
| Triphenylamine | 4 |
| Indole | 5 |
| Naphthylamine | 6 |
| Aniline | 7 |
| 4-nitroaniline | 8 |
| 4-dimethylaminoaniline | 9 |
| 3,5-dimethylaniline | 10 |
| 2-benzoylaniline | 11 |
| 2-bromoaniline | 12 |
| 2,4-dibromoaniline | 13 |
| 2,4-dimethylaniline | 14 |
| 2,6-dichloroaniline | 15 |
| N,N-dimethylaniline | 16 |
| 4-carboxylate-N,N-dimethylaniline | 17 |
| 4-bromo-N,N-dimethylaniline | 18 |
| 4-methyl-N,N-dimethylaniline | 19 |

EXAMPLES 20–24

In Table II below each example represents another photosensitive composition of the invention, of the same composition of Examples 3–19 except for substitution of the indicated phenolic compound in place of the aromatic amines. The compositions of each example were prepared and tested for photoinduced color substantially as described in Examples 3–19, giving in each test bright pink to red colors.

Table II

| Phenolic compound: | Example |
|---|---|
| Phenol | 20 |
| *m*-Cresol | 21 |
| *p*-Cresol | 22 |
| 3-benzoylphenol | 23 |
| Resorcinol | 24 |

We claim:

1. A photosensitive composition which comprises a pyrazole compound of the formula

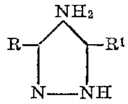

wherein R and $R^1$ are aryl, substituted or unsubstituted, or alkyl; an aromatic amine of the formula $$\begin{array}{c}B-N-X\\ |\\ Y\end{array}$$

where B is aryl and X and Y are alkyl, aryl, aralkyl, alkaryl, or hydrogen, said B having a hydrogen atom in a position ortho or para to said amino group or a phenol having a hydrogen atom in a position ortho or para to the hydroxy group; and an organic halogen compound.

2. The composition of claim 1 wherein said pyrazole compound, said aromatic amine or phenol, and said organic halogen compound are present in at least equivalent proportions.

3. The composition of claim 1 wherein the aromatic amine has the formula $$\begin{array}{c}B-N-X\\ |\\ Y\end{array}$$

where B is phenyl, naphthyl or anthracyl, and X and Y are alkyl, aryl, aralkyl, alkaryl, or hydrogen, said B having hydrogen at least at a position ortho or para to said N; and wherein the organic halogen compound is a halogenated hydrocarbon.

4. The composition of claim 1 wherein the pyrazole compound is 4-amino-3,5-diphenylpyrazole.

5. The composition of claim 4 wherein the aromatic amine is diphenylamine and the organic halogen compound is chloroform.

6. The composition of claim 4 wherein the aromatic amine is 4-bromo-N,N-dimethylaniline and the organic halogen compound is $\alpha,\alpha,\beta,\beta$-tetrabromo-o-xylene.

7. A photosensitive article which comprises a substrate or matrix contacted with the composition of claim 1.

8. The article of claim 7 wherein said substrate or matrix is paper.

9. The article of claim 7 wherein said substrate is a siliceous material.

10. The article of claim 7 wherein said substrate or matrix is a thermoplastic resin.

References Cited

UNITED STATES PATENTS

| | | | |
|---|---|---|---|
| 3,042,515 | 7/1962 | Wainer | 96—48 |
| 3,390,994 | 7/1968 | Cescon | 96—90 |

NORMAN G. TORCHIN, Primary Examiner

R. E. FICHTER, Assistant Examiner